(12) United States Patent
Min et al.

(10) Patent No.: US 12,526,930 B2
(45) Date of Patent: Jan. 13, 2026

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Tae Hong Min, Suwon-si (KR); Eun Su Kwon, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 137 days.

(21) Appl. No.: 18/115,871

(22) Filed: Mar. 1, 2023

(65) Prior Publication Data
US 2024/0032208 A1  Jan. 25, 2024

(30) Foreign Application Priority Data
Jul. 19, 2022  (KR) .................. 10-2022-0088935

(51) Int. Cl.
*H05K 3/46* (2006.01)
*H01L 23/498* (2006.01)
(Continued)

(52) U.S. Cl.
CPC .......... *H05K 3/4626* (2013.01); *H05K 1/036* (2013.01); *H05K 3/1258* (2013.01);
(Continued)

(58) Field of Classification Search
CPC .. H05K 3/4626; H05K 3/1258; H05K 3/4694; H05K 3/20; H05K 3/4644;
(Continued)

(56) References Cited

U.S. PATENT DOCUMENTS

2014/0347837 A1* 11/2014 Kariya ................. H05K 3/4694
156/247
2016/0105960 A1* 4/2016 Sakamoto ........... H01L 23/5383
174/262

(Continued)

FOREIGN PATENT DOCUMENTS

JP  2016-081961 A  5/2016
JP  2018-006466 A  1/2018
(Continued)

OTHER PUBLICATIONS

Office Action issued in corresponding Korean Patent Application No. 10-2022-0088935 on Nov. 21, 2025, with English translation.

*Primary Examiner* — Timothy J Thompson
*Assistant Examiner* — Amol H Patel
(74) *Attorney, Agent, or Firm* — MORGAN, LEWIS & BOCKIUS LLP

(57) ABSTRACT

A printed circuit board includes a first build-up insulating layer; an interconnect structure buried in an upper side of the first build-up insulating layer and including one or more insulating layers, one or more wiring layers, and one or more via layers; an adhesive disposed between an upper surface of the first build-up insulating layer and an upper surface of the interconnect structure, and having an upper surface exposed from the upper surface of the first build-up insulating layer; and a metal bump including a via portion penetrating the adhesive and a protrusion protruding to the upper surface of the adhesive.

15 Claims, 13 Drawing Sheets

(51) Int. Cl.
*H05K 1/03* (2006.01)
*H05K 3/12* (2006.01)
*H05K 3/40* (2006.01)

(52) U.S. Cl.
CPC . *H05K 3/4007* (2013.01); *H05K 2201/10204* (2013.01); *H05K 2203/049* (2013.01); *H05K 2203/176* (2013.01)

(58) Field of Classification Search
CPC ........ H05K 3/4697; H05K 3/46; H05K 1/036; H05K 1/0296; H05K 1/0298; H05K 1/115; H01L 23/49822
See application file for complete search history.

(56) References Cited

U.S. PATENT DOCUMENTS

| | | | |
|---|---|---|---|
| 2016/0141234 A1* | 5/2016 | We | H01L 25/0655 |
| | | | 361/767 |
| 2018/0005844 A1 | 1/2018 | Sorimachi | |
| 2020/0083179 A1 | 3/2020 | Lee et al. | |
| 2022/0051988 A1* | 2/2022 | Patil | H01L 21/4853 |
| 2022/0141953 A1 | 5/2022 | Jeon et al. | |
| 2022/0199538 A1* | 6/2022 | Lu | H01L 23/49822 |

FOREIGN PATENT DOCUMENTS

| | | |
|---|---|---|
| KR | 10-2020-0028602 A | 3/2020 |
| KR | 10-2022-0058187 A | 5/2022 |

\* cited by examiner

PRINTED CIRCUIT BOARD AND METHOD OF MANUFACTURING THE SAME

CROSS-REFERENCE TO RELATED APPLICATIONS

This application claims benefit of priority to Korean Patent Application No. 10-2022-0088935 filed on Jul. 19, 2022 in the Korean Intellectual Property Office, the disclosure of which is incorporated herein by reference in its entirety.

TECHNICAL FIELD

The present disclosure relates to a printed circuit board including interconnect structures such as bridges and patches buried therein, and a method of manufacturing the same.

BACKGROUND

As the number of CPU and GPU cores of server products has rapidly increased, a die-splitting technique of effectively increasing the number of cores has been widely used. Also, as demand for a package including a high bandwidth memory (HBM) has increased, a technique for connecting a die to a die with a circuit having a fine circuit line width has been necessary. To satisfy these technical requirements, a technique of burying a silicon bridge and a technique of using a silicon interposer have been developed, but there is a limitation in the commercialization thereof due to a price and a complicated assembly process. For example, a technique of burying a silicon bridge may require encapsulation on a front surface of a substrate on which a die is mounted, such that a relatively expensive process such as CMP may be necessary.

SUMMARY

An aspect of the present disclosure is to provide a printed circuit board in which flatness of a front surface on which a semiconductor chip is mounted may be excellent, such that relatively expensive processes such as CMP may be unnecessary and price competitiveness may thus be excellent, and a method of manufacturing the same.

An aspect of the present disclosure is to attach and embed a connecting structure on an outermost side of a build-up insulating layer of a substrate using an adhesive and to form a metal bump including a via portion and a protrusion on the adhesive.

According to an aspect of the present disclosure, a printed circuit board includes a first build-up insulating layer; an interconnect structure buried in an upper side of the first build-up insulating layer and including one or more insulating layers, one or more wiring layers, and one or more via layers; an adhesive disposed between an upper surface of the first build-up insulating layer and an upper surface of the interconnect structure, and having an upper surface exposed from the upper surface of the first build-up insulating layer; and a metal bump including a via portion penetrating the adhesive and a protrusion protruding to the upper surface of the adhesive.

According to an aspect of the present disclosure, a method of manufacturing a printed circuit board includes preparing a carrier substrate including a metal layer disposed on at least one surface thereof; forming a 1-1 build-up insulating layer on the metal layer; forming a cavity in the 1-1 build-up insulating layer; attaching an interconnect structure including one or more insulating layers, one or more wiring layers, and one or more via layers to the cavity, using an adhesive; forming a 1-2 build-up insulating layer burying the interconnect structure and filling at least a portion of the cavity on the 1-1 build-up insulating layer; separating the carrier substrate; removing at least a portion of the metal layer; and forming a metal bump including a via portion penetrating the adhesive and a protrusion protruding to one surface of the adhesive.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
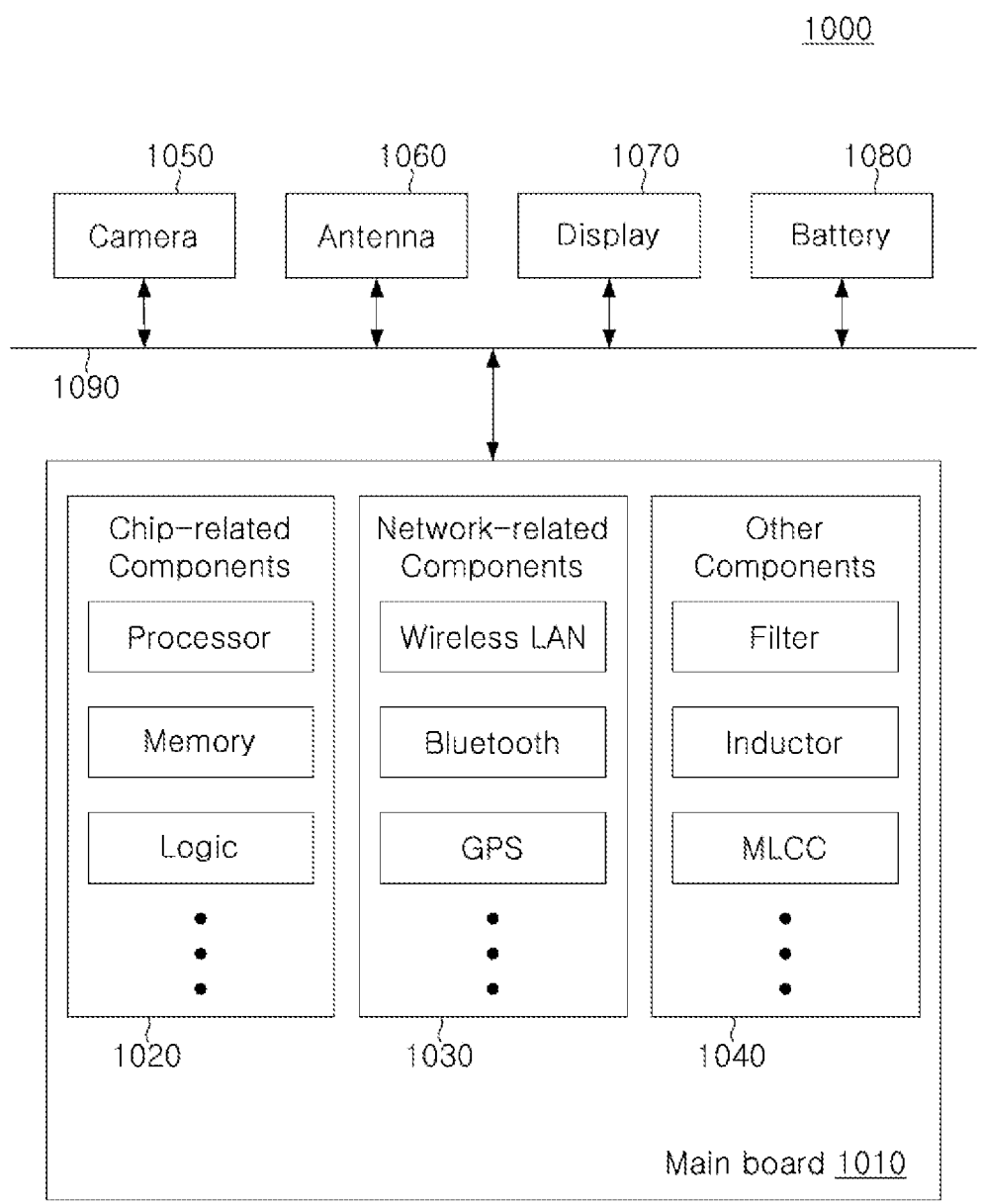
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip-related component 1020 may have a form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
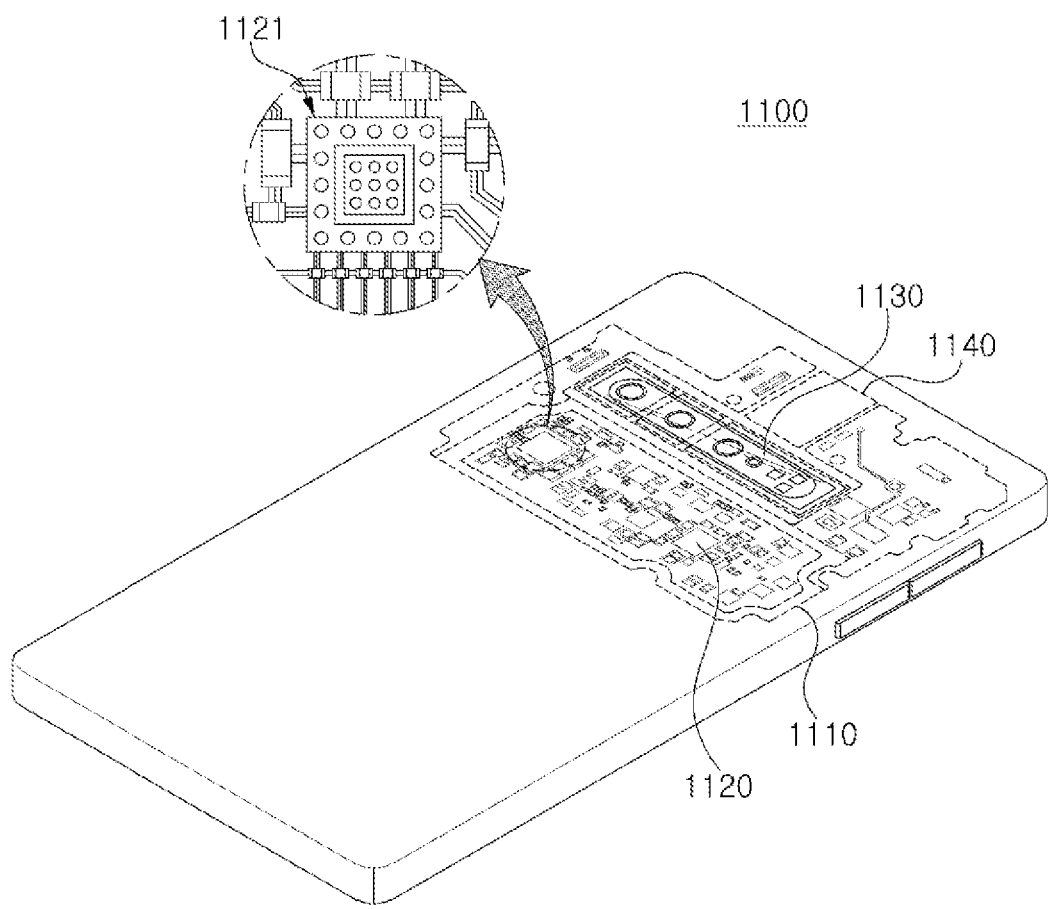
FIG. 2 is a perspective diagram illustrating an example of an electronic device.

FIG. 2 is a perspective diagram illustrating an example of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components that may or may not be physically or electrically connected to the motherboard 1110, such as a camera module 1130, may be accommodated in the body 1101. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are buried. The electronic device is not necessarily limited to the smartphone 1100, and may be other electronic devices as described above.

Semiconductor Package Including Interposer

Generally, a semiconductor chip may have a large number of micro-electric circuits integrated therein, but the semiconductor chip may not work as a finished semiconductor product by itself, and it may be highly likely that the semiconductor chip may be damaged by an external physical or chemical impact. Accordingly, instead of using the semiconductor chip as is, the semiconductor chip may be packaged and used in electronic devices in a packaged state.

The semiconductor packaging may be necessary because there may be a difference in circuit widths of a semiconductor chip and a main board of the electronic device in terms of electrical connection. Specifically, in the case of a semiconductor chip, the size of a connection pad and a spacing between the connection pads may be extremely fine, whereas in the case of a main board used for electronic devices, the size of a component mounting pad and a spacing between the component mounting pads may be relatively larger than the scale of the semiconductor chip. Accordingly, it may be difficult to directly mount the semiconductor chip on such a main board, and a packaging technique for buffering a difference in circuit widths between the semiconductor chip and the main board may be necessary.

Hereinafter, a semiconductor package including an interposer manufactured using such a packaging technique will be described in greater detail with reference to the drawings.

Figure 3:
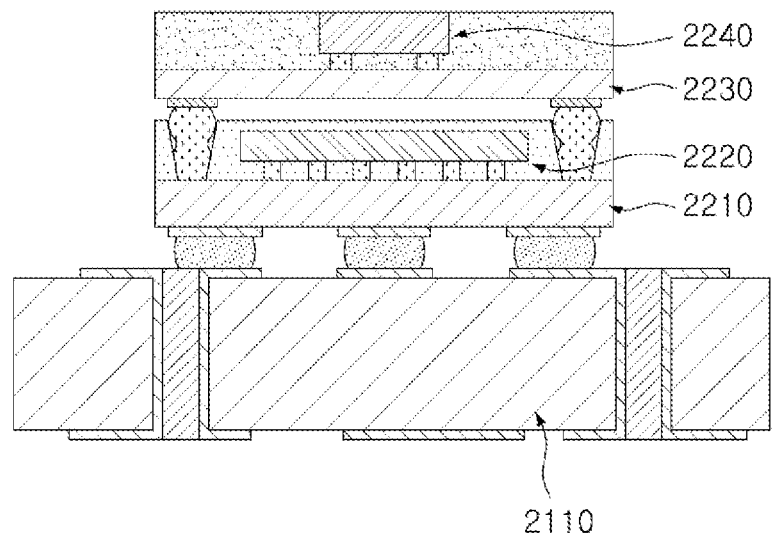
FIG. 3 is a cross-sectional diagram illustrating an example in which a BGA package is mounted on a main board of an electronic device.

FIG. 3 is a cross-sectional diagram illustrating an example in which a BGA package is mounted on a main board of an electronic device.

As for an application specific integrated circuit (ASIC), such as a graphics processing unit (GPU) among semiconductor chips, as the price of each chip may be relatively high, it may be important to perform packaging with a high yield. For this purpose, a ball grid array (BGA) substrate 2210 which may redistribute thousands to hundreds of thousands of connection pads may be prepared before the semiconductor chip is mounted, an expensive semiconductor chip such as a GPU 2220 may be subsequently mounted and packaged on the BGA substrate 2210 using a surface mounting technique (SMT), and may be finally mounted on the main board 2110.

Meanwhile, in the case of the GPU 2220, it may be necessary to reduce a signal path with a memory such as a high bandwidth memory (HBM), and to this end, a semiconductor chip such as an HBM 2240 may be mounted on an interposer 2230 and packaged, and the semiconductor chip may be laminated on the package on which the GPU 2220 is mounted in the form of a package on package (POP). However, in this case, the thickness of the device may increase excessively, and there may be a limitation in reducing the signal path as well.

Figure 4:
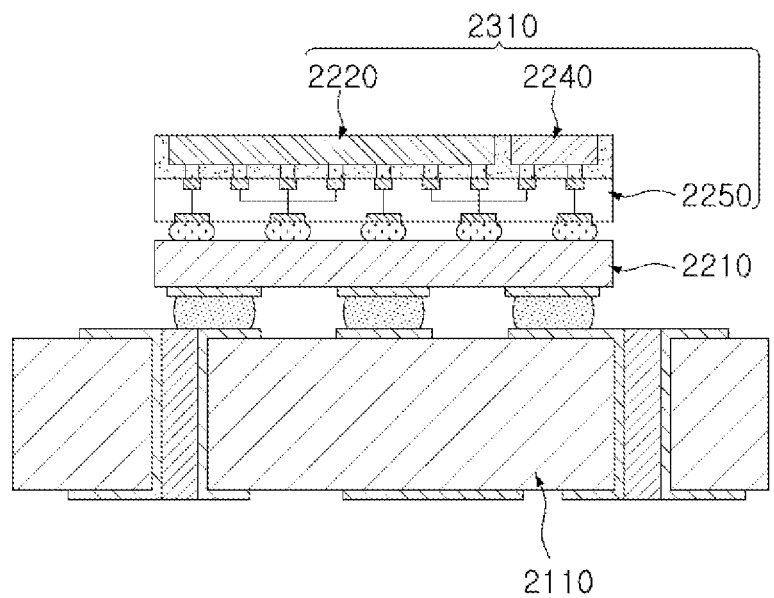
FIG. 4 is a cross-sectional diagram illustrating an example in which a silicon interposer package is mounted on a main board.

FIG. 4 is a cross-sectional diagram illustrating an example in which a silicon interposer package is mounted on a main board.

To address the above-described issue, it may be considered to manufacture a semiconductor package 2310 including an organic interposer using an interposer technique for surface-mounting a first semiconductor chip such as GPU 2220 and a second semiconductor chip such as HBM 2240 on the silicon interposer 2250 side by side and packaging the semiconductor chips. In this case, the GPU 2220 and the HBM 2240 having thousands to hundreds of thousands of connection pads may be redistributed through the interposer 2250, and may be electrically connected to each other through a reduced path. Also, when the semiconductor package 2310 including the organic interposer is mounted again on the BGA substrate 2210 and is redistributed, the semiconductor package 2310 may be finally mounted on the main board 2110.

However, in the case of the silicon interposer 2250, it may be difficult to form a through silicon via (TSV), and the manufacturing costs may also be high, which may be disadvantageous for implementing a large area and reducing the costs.

Figure 5:
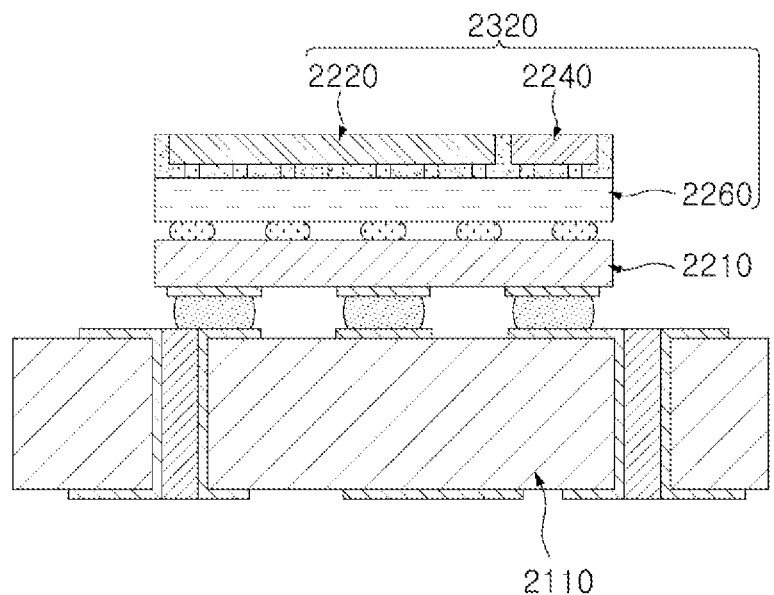
FIG. 5 is a cross-sectional diagram illustrating an example in which an organic interposer package is mounted on a main board.

FIG. 5 is a cross-sectional diagram illustrating an example in which an organic interposer package is mounted on a main board.

To address the above-described issue, it may be considered to use the organic interposer 2260 instead of the silicon interposer 2250. For example, it may be considered to manufacture a semiconductor package 2320 including an organic interposer using an interposer technique for surface-mounting a first semiconductor chip such as GPU 2220 and a second semiconductor chip such as HBM 2240 on the silicon interposer 2250 side by side and packaging the semiconductor chips. In this case, the GPU 2220 and the HBM 2240 having thousands to hundreds of thousands of connection pads may be redistributed through the interposer 2260, and may be electrically connected to each other through a reduced path. Also, by mounting again and redistributing the semiconductor package 2310 including the organic interposer on the BGA substrate 2210, the semiconductor package 2310 may be finally mounted on the main board 2110, which may be advantageous for implementing a large area and reducing costs.

Figure 6:
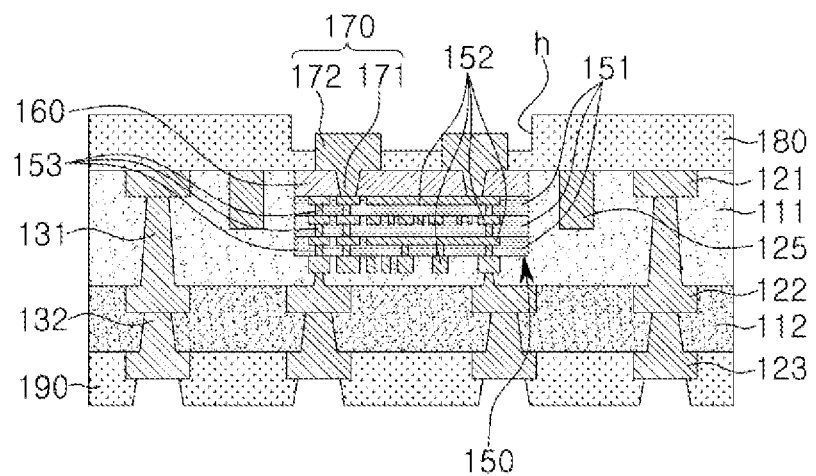
FIG. 6 is a cross-sectional diagram illustrating an example of a printed circuit board.

However, in the case of using the organic interposer 2260, the semiconductor chips 2220 and 2240 may need to be mounted on the organic interposer 2260 and may need to be mounted on the BGA substrate 2210 again, the process may become complicated, and a packaging yield may be lowered.
Printed Circuit Board Including Interconnect Structure and Semiconductor Package FIG. 6 is a cross-sectional diagram illustrating an example of a printed circuit board.

Referring to the drawing, a printed circuit board 100 according to an example may include a first build-up insulating layer 111, an interconnect structure 150 buried in the upper side of the first build-up insulating layer 111 and including one or more insulating layers 151, one or more wiring layers 152, and one or more via layers 153, an adhesive 160 disposed between the upper surface of the first build-up insulating layer 111 and the upper surface of the interconnect structure 150 and having an upper surface exposed from the upper surface of the first build-up insulating layer 111, a via portion 171 penetrating adhesive 160, and a metal bump 170 including a protrusion 172 protruding to the upper surface of the adhesive 160. The via portion 171 and the protrusion 172 included in the metal bump 170 may be integrated without a boundary therebetween.

As described above, in the printed circuit board 100 according to an example embodiment, the interconnect structure 150 may be buried in the upper side of the first build-up insulating layer 111 using the adhesive 160, such that the interconnect structure 120A may provide an outermost mounting surface of the substrate, and further, the metal bump 170 for mounting the semiconductor chip may be directly formed on the adhesive 160, and accordingly, flatness of the front surface on which the semiconductor chip is mounted may be excellent such that an expensive process such as CMP may be unnecessary, and a packaging yield may improve. Also, since the shortest interconnection path may be provided after the semiconductor chip is mounted, which may be advantageous for signal quality.

Meanwhile, the upper surfaces of the first build-up insulating layer 111 and the upper surfaces of the adhesive 160 may be substantially coplanar with each other. The configuration of being substantially coplanar may include the configuration in which objects are completely disposed on a coplanar plane, and also the configuration in which objects are disposed on an almost coplanar plane due to a process error. That is, a minute difference due to a process error may be included. In this case, flatness of the front surface of the substrate may improve.

Meanwhile, the printed circuit board 100 may further include a first resist layer 180 disposed on the first build-up insulating layer 111 and the adhesive 160 and covering at least a portion of the protrusion 172. In one example, the first resist layer 180 may cover at least a portion of a side surface of the protrusion 172. The first resist layer 180 may have a groove portion h for partially exposing the protrusion 172, and a bottom surface of the groove portion h may be disposed on a level between the upper and lower surfaces of the protrusion 172. For example, the protrusion 172 may protrude from the bottom surface of the groove portion h. That is, the upper surface of the first resist layer 180 may have a step difference due to the groove portion h. In this case, the semiconductor chip may be more stably mounted in the groove portion h, and the overall thickness of the package may be effectively reduced after the semiconductor chip is mounted.

The printed circuit board 100 may have a buried trace substrate (ETS) structure. For example, the printed circuit board 100 may include a first build-up wiring layer 121 buried in the upper side of the first build-up insulating layer 111 and having an upper surface exposed from the upper surface of the first build-up insulating layer 111, a second build-up wiring layer 122 disposed on the lower surface of the first build-up insulating layer 111, a first build-up via layer 131 penetrating through the first build-up insulating layer 111 and electrically connecting the first and second build-up wiring layers 121 and 122 to each other, a second build-up insulating layer 112 disposed on the lower surface of the first build-up insulating layer 111 and burying the second build-up wiring layer 122, a third build-up wiring layer 123 disposed on the lower surface of the second build-up insulating layer 112, and/or a second build-up via layer 132 penetrating the second build-up insulating layer 112 and electrically connecting the second and third build-up wiring layers 122 and 123. In this case, the upper surface of the first build-up wiring layer 121 may be substantially coplanar with the upper surface of the first build-up insulating layer 111 and the upper surface of the adhesive 160. The configuration of being substantially coplanar may include the configuration in which objects are completely disposed on a coplanar plane, and also the configuration in which objects are disposed on an almost coplanar plane due to a process error. That is, a minute difference due to a process error may be included. In this case, flatness of the front surface of the substrate may improve.

Meanwhile, the printed circuit board 100 may further include a heat dissipation metal layer 125 buried in the upper side of the first build-up insulating layer 111 and having an upper surface exposed from the upper surface of the first build-up insulating layer 111. The heat dissipation metal layer 125 may be disposed on the same layer as the first build-up wiring layer 121, and may have a thickness greater than a thickness of the first build-up wiring layer 121, which may be effective for heat dissipation of the interconnect structure and a periphery of the interconnect structure. The thickness may be measured using a scanning microscope or an optical microscope, such as, for example, an optical microscope (×1000) manufactured by Olympus, with respect to the ground or cut-out cross-section of the printed circuit board 100.

Meanwhile, the printed circuit board 100 may further include a second resist layer 190 disposed on the lower surface of the second build-up insulating layer 112 and covering at least a portion of the third build-up wiring layer 123. The second resist layer 190 may have a plurality of openings for exposing at least a portion of the third build-up wiring layer 123.

Hereinafter, the components of the printed circuit board 100 according to an example will be described in greater detail with reference to the drawings.

Each of the first and second build-up insulating layers 111 and 112 may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber (glass fiber, glass cloth, glass fabric) together with an inorganic filler, such as, for example, an Ajinomoto build-up film (ABF), prepreg, or the like, may be used, but an example embodiment thereof is not limited thereto. As an example, but not limited thereto, the first and second build-up insulating layers 111 and 112 may include substantially the same insulating material, such as, for example, ABF, but an example embodiment thereof is not limited thereto. The configuration in which substantially the same insulating material may be used may indicate that the same insulating material of the same brand name may be used.

The first build-up insulating layer 111 may include a plurality of layers. For example, the first build-up insulating layer 111 may include a 1-1 build-up insulating layer having a cavity and a 1-2 build-up insulating layer covering the 1-1 build-up insulating layer and filling the cavity. The 1-1 build-up insulating layer and the 1-2 build-up insulating layer may include substantially the same insulating material, such as, for example, ABF, but an example embodiment thereof is not limited thereto. The configuration in which substantially the same insulating material may be used may indicate that the same insulating material of the same brand name may be used.

Each of the first to third build-up wiring layers 121, 122, and 123 may include a metal material. A metal material may include copper (Cu), aluminum (Al), silver (Ag), tin (Sn), gold (Au), nickel (Ni), lead (Pb), titanium (Ti), or alloys thereof. The second and third build-up wiring layers 122 and 123 may include an electroless plating layer (or chemical copper) and an electrolytic plating layer (or electrolytic copper), but an example embodiment thereof is not limited thereto. If desired, a copper foil may be further included. The first build-up wiring layer 121 may include only an electrolytic plating layer (or electrolytic copper) by removing a metal layer used as a seed layer. Each of the first to third build-up wiring layers 121, 122, and 123 may perform various functions according to the design of the corresponding layer. For example, a ground pattern, a power pattern, and a signal pattern may be included. Here, the signal pattern may include various signals other than a ground pattern and a power pattern, that is, for example, a data signal. Each of these patterns may include a line pattern, plane pattern and/or pad pattern.

The heat dissipation metal layer 125 may include a metal material. A metal material may include copper (Cu), aluminum (Al), silver (Ag), tin (Sn), gold (Au), nickel (Ni), lead (Pb), titanium (Ti), or alloys thereof. The heat dissipation metal layer 125 may include an electroless plating layer (or chemical copper) and an electrolytic plating layer (or electrolytic copper), but an example embodiment thereof is not limited thereto. If desired, a copper foil may be further included. The heat dissipation metal layer 125 may be electrically connected to the ground pattern of the first build-up wiring layer 121 if desired.

Each of the first and second build-up via layers 131 and 132 may include a metal material. A metal material may include copper (Cu), aluminum (Al), silver (Ag), tin (Sn), gold (Au), nickel (Ni), lead (Pb), titanium (Ti), or alloys thereof. The first and second build-up via layers 131 and 132 may be formed together when forming the second and third build-up wiring layers 122 and 123, respectively, and accordingly, the first and second build-up via layers 131 and 132 may include an electroless plating layer (or chemical copper) and an electrolytic plating layer (or electrolytic copper), but an example embodiment thereof is not limited thereto. Each of the first and second build-up via layers 131 and 132 may be a field type in which the via hole is filled with a metal material, but an example embodiment thereof is not limited thereto, or the first and second build-up via layers 131 and 132 may be a conformal type in which a metal material is disposed along the wall surface of the via hole. Each of the first and second via layers 131 and 132 may have a tapered shape in which a width of the upper surface is narrower than the width of the bottom surface in cross-section, and the tapered shape may be tapered in the same direction. Each of the first and second build-up via layers 131 and 132 may perform various functions according to the design of the corresponding layer. For example, a ground via, a power via, and a signal via may be included. The signal via may include a via for transmitting various signals other than a ground via and a power via, such that for example, a data signal.

The number of the build-up insulating layers 111 and 112, the number of the build-up wiring layers 121, 122, and 123, and the number of the build-up via layers 131 and 132 may be greater than the examples illustrated in the drawings, and accordingly the descriptions described in the aforementioned example embodiment may be applied.

The interconnect structure 150 may include silicon dioxide as an insulating body, which may be a silicon bridge manufactured by forming wiring through a deposition process, or an organic bridge manufactured using an organic insulating material as an insulating body and forming wiring through a plating process. Preferably, the interconnect structure 150 may be an organic bridge, and in this case, reliability issues due to CTE mismatch may hardly occur. Also, process difficulty and costs for manufacturing the interconnect structure 150 may be reduced. Also, the printed circuit board 100 may have an organic structure, which may be advantageous for power resistance and signal quality. Also, the interconnect structure 150 may have an ETS structure. As such, when the interconnect structure 150 is formed in the form of a coreless substrate, a wiring design may be enabled with a fine pitch. Also, as compared to the silicon bridge, the interconnect structure 150 may be manufactured at a lower cost, and the process may be simplified. As the organic insulating material, a photoimageable insulating material (PID) may be used, but an example embodiment thereof is not limited thereto.

The insulating layer 151 may include an insulating material. The insulating material may be an organic insulating material such as a photoimageable insulating material (PID). When a photoimageable insulating material (PID) is used as the material of the insulating layer 151, the thickness of each insulating layer 151 may be reduced and photo-via holes may be formed, such that wiring layer 152 may be designed with high density. However, the material is not limited thereto, and other organic insulating materials such as ABF may be used. Also, the insulating layer 151 may include an inorganic insulating material such as silicon. The insulating layer 1551 may include a plurality of layers, and the number of layers is not limited to any particular example. Boundaries between the plurality of insulating layers 151 may be distinct or may be indistinct.

The wiring layer 152 may provide a microcircuit path such as die-to-die interconnection and die-to-substrate interconnection. The wiring layer 152 may include a plurality of layers, and the number of layers is not limited to any particular example. The wiring layer 152 may perform various functions according to the design of the corresponding layer, and may include at least a signal pattern. The pattern may include a line pattern and/or a pad pattern. The wiring layer 152 may include a metal material, such as copper (Cu), aluminum (Al), silver (Ag), tin (Sn), gold (Au), nickel (Ni), lead (Pb), titanium (Ti), or alloys thereof. The wiring layer 152 may include an electroless plating layer (or chemical copper) and an electrolytic plating layer (or copper), and an uppermost wiring layer 152 may include only an electrolytic plating layer (or copper). An example embodiment thereof is not limited thereto.

The wiring layer 152 may have circuit density higher than that of the first to third build-up wiring layers 121, 122, and 123. That is, the wiring layer 152 may include higher-density circuits. For example, an average pitch of the wirings included in the wiring layer 152 may be smaller than an average pitch of the wirings included in the first to third build-up wiring layers 121, 122, and 123. Also, an average interlayer insulation distance between the wiring layers 152 may be smaller than an average interlayer insulation distance between the first to third build-up wiring layers 121, 122, and 123. The pitch may be measured by imaging a cross-section of the printed circuit board 100 with a scanning microscope or an optical microscope, and the average pitch may be an average value of pitches between wirings measured at five arbitrary points. The interlayer insulation distance may also be measured by imaging a cross-section of the printed circuit board 100 with a scanning microscope or an optical microscope, and the average interlayer insulation distance may be an average value of insulation distances between adjacent wirings or redistributions measured at five arbitrary points.

The via layer 153 may electrically connect the wiring layers 152 disposed on different layers to each other. The via layer 153 may perform various functions according to the design of the corresponding layer, and may include a metal material such as copper (Cu), aluminum (Al), silver (Ag), tin (Sn), gold (Au), nickel (Ni), lead (Pb), titanium (Ti) or an alloy thereof. Similarly to the first to third build-up via layers 132, 132, and 133, the via layer 153 may have a tapered shape in which a width of the upper surface is narrower than a width of the bottom surface on the cross-section, and the tapered shapes may be tapered in the same direction. The via layer 153 may include an electroless plating layer (or chemical copper) and an electrolytic plating layer (or electrolytic copper).

The adhesive 160 may include a known adhesive material. For example, the adhesive 160 may include a known epoxy-based adhesive material, but an example embodiment thereof is not limited thereto. The adhesive 160 may be a film type, such as, for example, a die attach film (DAF), a bonding sheet (B/S), or the like, but an example embodiment thereof is not limited thereto. The adhesive 160 may have a low Df B/S having a dielectric loss (Df) smaller than that of the build-up insulating layers 111 and 112 and the insulating layer 151, and in this case, the adhesive 160 may be excellent in reducing signal loss.

The metal bump 170 may perform various functions according to a design, and may include at least a signal bump. The via portion 171 and the protrusion 172 included in the metal bump 170 may include a metal material such as copper (Cu), aluminum (Al), silver (Ag), tin (Sn), gold (Au), nickel (Ni), lead (Pb), titanium (Ti) or an alloy thereof. The via portion 171 and the protrusion portion 172 included in the metal bump 170 may include an electroless plating layer (or chemical copper) and an electrolytic plating layer (or electrolytic copper), and may be integrally formed with each other. The via portion 171 may penetrate through the adhesive 160 and may be connected to the uppermost wiring layer 152, and may have a tapered shape in which a width of the upper surface is narrower than a width of the lower surface in cross-section.

The first and second resist layers 180 and 190 may be disposed on the outermost side of the printed circuit board 100 and may protect internal components. A material of the first and second resist layers 180 and 190 are not limited to any particular example. For example, an insulating material may be used, and in this case, a solder resist may be used as the insulating material.

The printed circuit board 100 may be configured as a package substrate on which one or more semiconductor chips are mounted. Alternatively, the printed circuit board 100 may be configured as a microcircuit board on which one or more semiconductor chips are mounted. Such a microcircuit board may be mounted on a separate package board, may be attached to the outermost side of the separate package board, or may be buried in a package board. Passive components may be buried in such a separate package substrate, and other reinforcing layers may be disposed therein for warpage control. The reinforcing layer may have various materials such as metal, graphite, and carbon materials.

The semiconductor chip may be mounted on the first resist layer 180 of the printed circuit board 100, and may be electrically connected to the metal bump 170 using a solder bump. For example, the semiconductor chip may be disposed on the groove portion h and may be connected to the metal bump 170. Alternatively, the semiconductor chip may be disposed on a region other than the groove portion h of the first resist layer 180. In this case, an opening for exposing the first build-up wiring layer 121 may be formed in the first resist layer 180 if desired, and solder bumps may be formed on the openings such that the semiconductor chip may be electrically connected to the first build-up wiring layer 121. Alternatively, metal bumps or metal pads may be additionally disposed on the first build-up wiring layer 121. In this case, an opening for exposing the metal bumps or metal pads may be formed in the first resist layer 180, and the semiconductor chip may also be electrically connected to the first build-up wiring layer 121 by forming a solder bump on the opening. A plurality of semiconductor chips may be provided, and each semiconductor chip may be disposed as in the above-described example. However, the arrangement of the semiconductor chip is not limited thereto.

A semiconductor chip may include an integrated circuit (IC) die in which hundreds to millions of devices are integrated in a chip. In this case, the integrated circuit may be implemented as a logic chip such as, for example, a central processor (e.g., CPU), a graphics processor (e.g., GPU), a field programmable gate array (FPGA), a digital signal processor, a cryptographic processor, a microprocessor, a microcontroller, an application processor. (e.g., AP), analog-to-digital converter, an application-specific IC (ASIC), but an example embodiment thereof is not limited thereto, and the integrated circuit may be implemented as a memory chip such as a volatile memory (e.g., DRAM), a non-volatile memory (e.g., ROM), a flash memory, a high bandwidth memory (HBM), or another memory chip such as a power management IC (PMIC).

Each of the semiconductor chips may be formed based on an active wafer, and in this case, silicon (Si), germanium (Ge), gallium arsenic (GaAs) may be used as a base material included in each body. Various circuits may be formed in the body. A connection pad may be formed on each body, and the connection pad may include a conductive material such as aluminum (Al) or copper (Cu). The semiconductor chip may be a bare die. In this case, a metal bump may be disposed on the connection pad. The semiconductor chip may be a packaged die. In this case, an additional redistribution layer may be formed on the connection pad, and a metal bump may be disposed on the redistribution layer.

The semiconductor chip may be mounted on the printed circuit board 100 using solder bumps, and the solder bumps may be formed of a low-melting metal, such as, for example, solder such as tin (Sn)-aluminum (Al)-copper (Cu). However, this is merely an example, and the semiconductor chip may not be necessarily mounted through the solder bump. Each of the solder bumps may include multiple layers or a single layer. When each solder bump includes multiple layers, the solder bumps may include a copper pillar and solder, and when each solder bump includes a single-layer, the solder bumps may include a tin-silver solder or copper, but an example embodiment thereof is not limited thereto.

The semiconductor chip may be covered by a molding material, and the molding material may protect the semiconductor chip. The material of the molding material is not limited to any particular example, and a known molding material such as epoxy molding compound (EMC) may be used.

FIGS. 7 to 15 are diagrams illustrating an example of processes of manufacturing a printed circuit board in FIG. 6.

Referring to the drawings, the method of manufacturing a printed circuit board 100 according to an example may include preparing a carrier substrate 200 including metal layers 210, 220, and 230 disposed on at least one surface, forming a 1-1 build-up insulating layer 111-1 on the metal layers 210, 220, and 230, forming a cavity C in the 1-1 build-up insulating layer 111-1, attaching an interconnect structure 150 including one or more insulating layers, one or more wiring layers, and one or more via layers to the cavity C via an adhesive 160, forming a 1-2-th build-up insulating layer 111-2 burying the interconnect structure 150 and filling at least a portion of the cavity C on the 1-1 build-up insulating layer 111-1, separating the carrier substrate 200, removing at least a portion of the metal layer 210, 220, and 230, processing a via hole 171h in the adhesive 160, and forming a metal bump 170 including a via portion 171 penetrating the adhesive 160 and a protrusion 172 protruding to one surface of the adhesive 160.

Hereinafter, a method of manufacturing the printed circuit board 100 according to an example will be described in greater detail with reference to the drawings.

Figure 7:
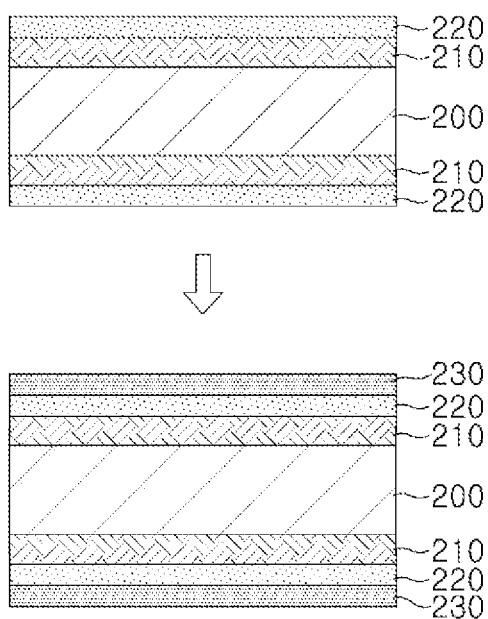
FIGS. 7 to 15 are diagrams illustrating an example of processes of manufacturing a printed circuit board in FIG. 6.

Referring to FIG. 7, the carrier substrate 200 including the plurality of metal layers 210, 220, and 230 disposed therein may be prepared on the upper and lower surfaces. For example, a copper clad laminate in which a carrier copper foil 210 and a base copper layer 220 are laminated on both sides of the carrier substrate 200 may be prepared, a nickel plating layer 230 may be formed on the base copper layer 220, and the plurality of metal layers 210, 220, and 230 may be formed on the carrier substrate 200. That is, in the plurality of metal layers 210, 220, and 230, the first and second metal layers 220 and 230 including different metals may be disposed on the carrier copper foil 210, but an example embodiment thereof is not limited thereto.

Figure 8:
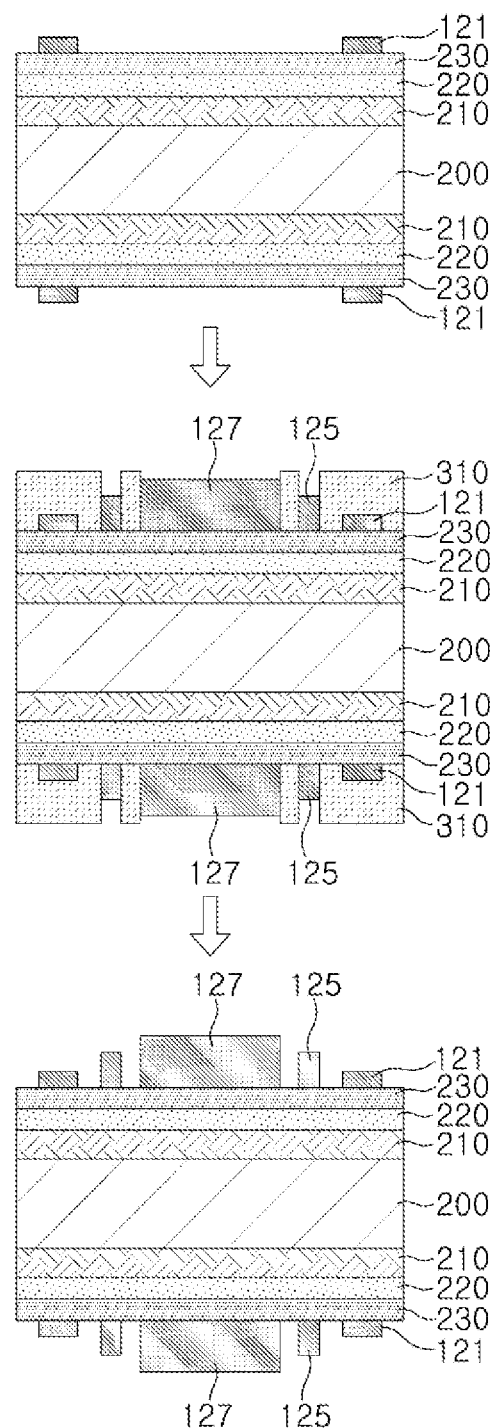

Referring to FIG. 8, a first build-up wiring layer 121 may be formed on the nickel plating layer 230. The first build-up wiring layer 121 may be formed by a plating process such as an additive process (AP), semi-AP (SAP), modified SAP (MSAP), or tenting (TT). Thereafter, the heat dissipation metal layer 125 and the dummy metal layer 127 may be formed by a plating process such as AP, SAP, or MSAP using the dry film 310. Thereafter, the dry film 310 may be removed. A known stripper may be used to remove the dry film 310.

Figure 9:
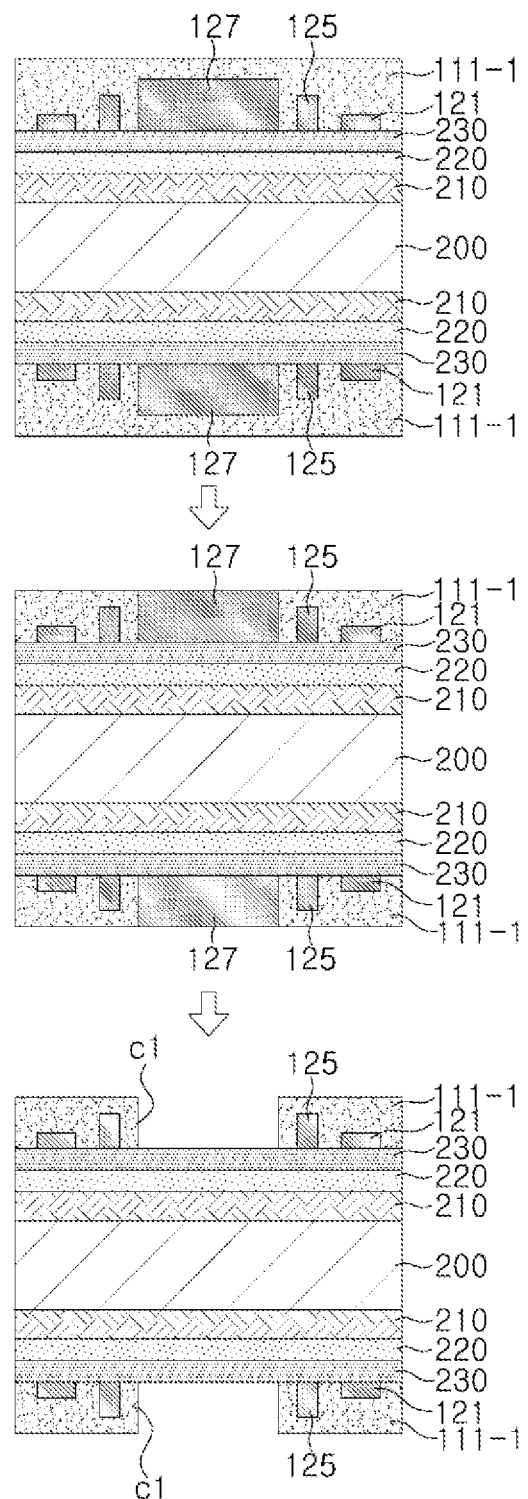

Referring to FIG. 9, the 1-1 build-up insulating layer 111-1 may be formed on the nickel plating layer 230. The 1-1 build-up insulating layer 111-1 may be formed by, for example, an ABF lamination process. Thereafter, the dummy metal layer 127 may be exposed by reducing the thickness of the 1-1 build-up insulating layer 111-1. As a method of exposing the dummy metal layer 127, a polishing method such as CMP, an etching method using plasma, a desmearing treatment, or the like may be used. Thereafter, the dummy metal layer 127 may be removed by an etching process. When the dummy metal layer 127 is removed, a first cavity c1 may be formed in the 1-1 build-up insulating layer 111-1.

Figure 10:
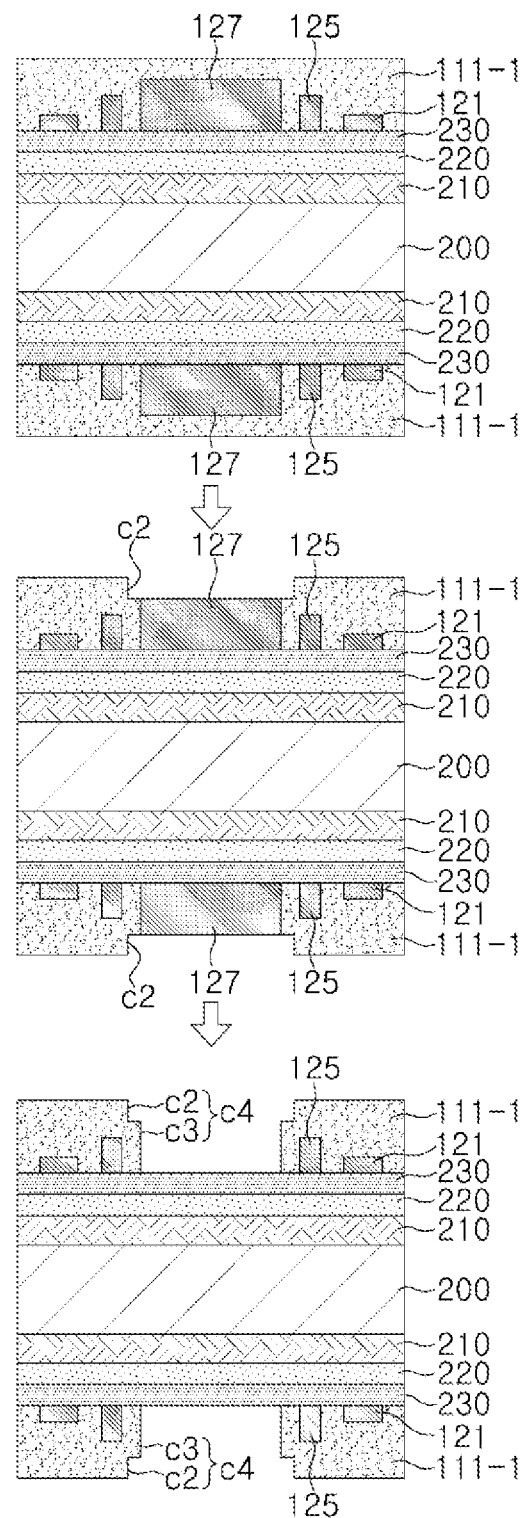

Alternatively, after forming the structure shown in FIG. 8, referring to FIG. 10, the 1-1 build-up insulating layer 111-1 may be formed on the nickel plating layer 230, and the dummy metal layer 127 may be exposed by partially removing the 1-1 build-up insulating layer 111-1 using a local skiving process or a local thinning process. In this case, a 2-1 cavity c2 exposing the dummy metal layer 127 may be formed in the 1-1 build-up insulating layer 111-1. Thereafter, the dummy metal layer 127 may be removed by an etching process. When the dummy metal layer 127 is removed, a 2-2 cavity c3 may be formed in the 1-1 build-up insulating layer 111-1. That is, a second cavity c4 formed by the 2-1 cavity c2 and the 2-2 cavity c3 connected to each other may be formed in the 1-1 build-up insulating layer 111-1. The 2-1 cavity c2 and the 2-2 cavity c3 may have different widths, and accordingly, the wall surface of the second cavity c4 may have a stepped structure.

Figure 11:
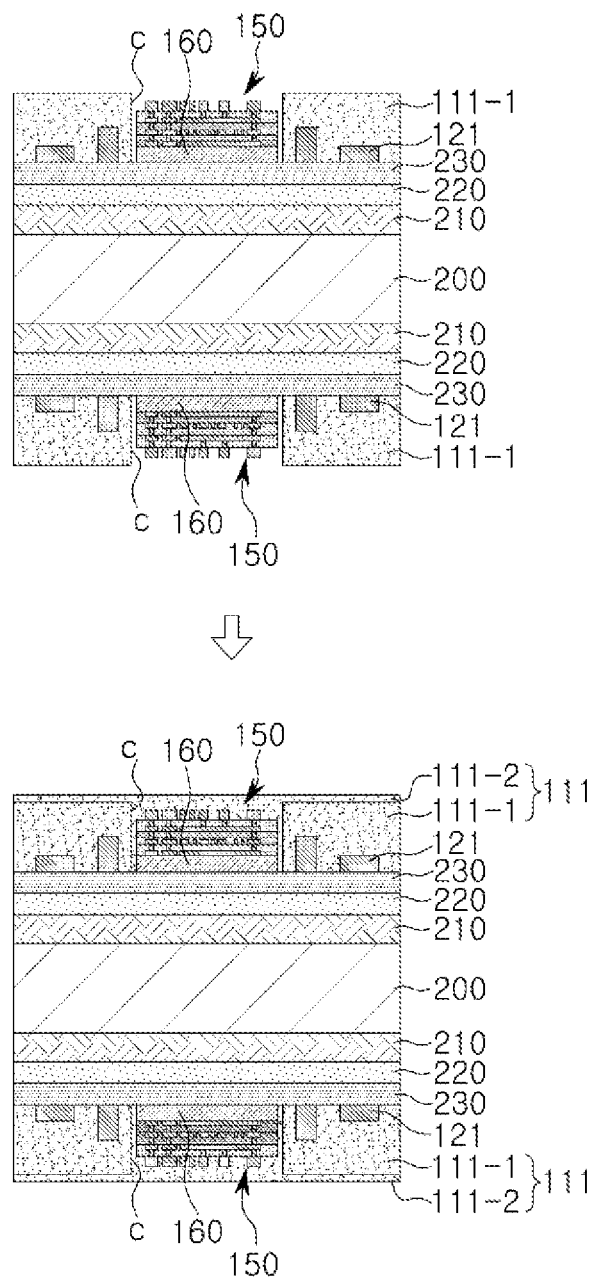

Referring to FIG. 11, the interconnect structure 150 may be attached to the cavity C of the 1-1 build-up insulating layer 111-1 using the adhesive 160. The cavity c may be the first cavity c1 or the second cavity c4 described above, but an example embodiment thereof is not limited thereto. The interconnect structure 150 may be separately manufactured using an ETS process, and may be disposed in the cavity C by attaching the buried pattern, which is the outermost wiring layer 152, to the adhesive 160. Thereafter, a 1-2 build-up insulating layer 111-2 burying the interconnect structure 150 and filling the cavity c may be formed on the 1-1 build-up insulating layer 111-1. The 1-2 build-up insulating layer 111-2 may be formed by, for example, an ABF lamination process. Accordingly, the first build-up insulating layer 111 may be formed. A boundary between the 1-1 build-up insulating layer 111-1 and the 1-2 build-up insulating layer 111-2 may be distinct, or a boundary between the 1-1 build-up insulating layer 111-1 and the 1-2 build-up insulating layer 111-2 may be indistinct.

Figure 12:
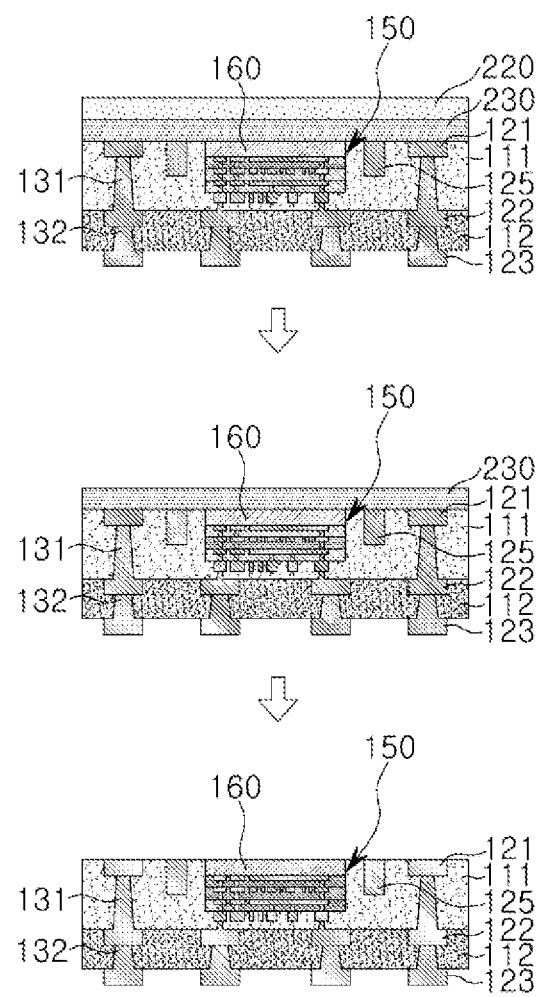

Referring to FIG. 12, the second build-up wiring layer 122 and the first build-up via layer 131 may be formed in the first build-up insulating layer 111 by plating process such as AP, SAP, MSAP, and TT. Also, the second build-up insulating layer 112 may be formed on the first build-up insulating layer 111 by ABF lamination. Also, the third build-up wiring layer 123 and the second build-up via layer 132 may be formed on the second build-up insulating layer 112 by a plating process such as AP, SAP, MSAP, TT. Thereafter, the carrier substrate 200 may be separated. The separation of the carrier substrate 200 may be separation of the carrier copper foil 210 and the base copper layer 220 from each other. Thereafter, the base copper layer 220 may be removed by etching. In this case, the nickel plating layer 230 may prevent etching of the first build-up wiring layer 121 and the heat dissipation metal layer 125. Thereafter, the nickel plating layer 230 may be removed by etching. An etchant used to remove the base copper layer 220 may be different from an etchant used to remove the nickel plating layer 230, and a plurality of etchings may be performed in order.

Figure 13:
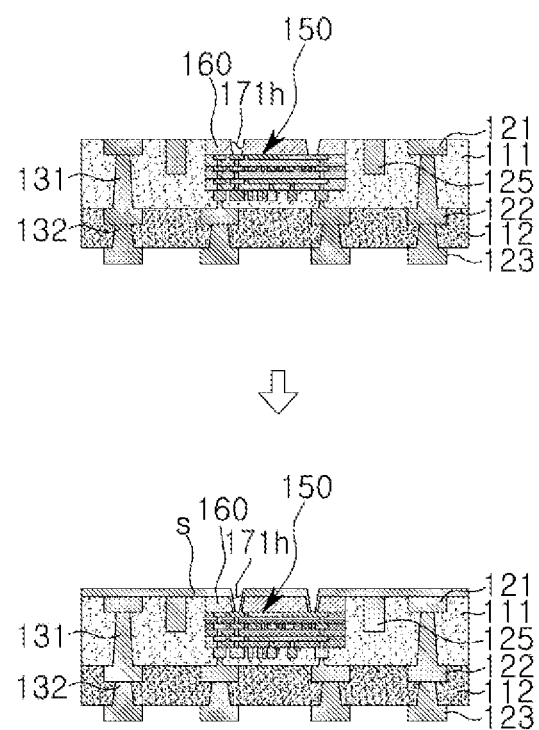

Referring to FIG. 13, a via hole 171h may be processed in the adhesive 160. To process the via hole 171h, laser processing or a mechanical drill may be used. The via hole 171h may expose at least a portion of the wiring layer disposed on the outermost side of the interconnect structure 150. Thereafter, a seed layer s may be formed on the first build-up insulating layer 111 and the via hole 171h by electroless plating.

Figure 14:
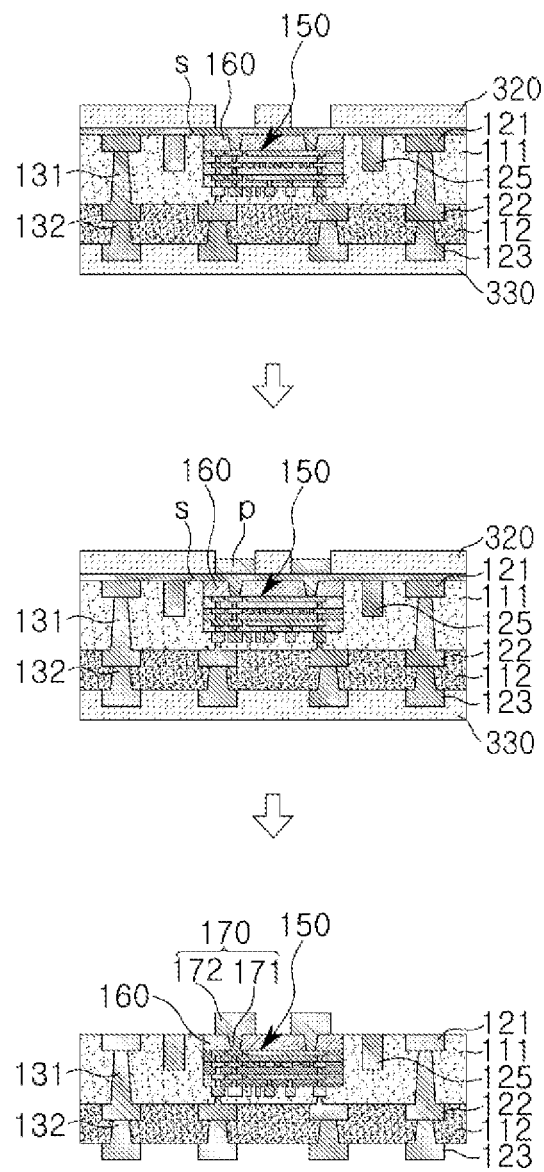

Referring to FIG. 14, a patterned dry film 320 may be formed on the seed layer s. Also, a plating layer p may be formed on the seed layer s exposed through the patterned opening of the dry film 320 by electroplating. Thereafter, the dry films 320 and 330 may be removed using a stripper, and the seed layer s, other than the region in which the plating layer p is formed, may be removed by etching, thereby forming the metal bump 170 including the via portion 171 and the protrusion 172.

Figure 15:
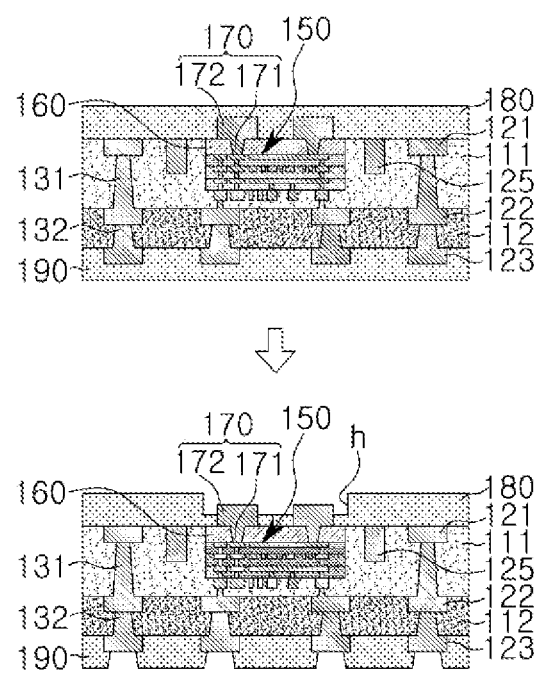

Referring to FIG. 15, a first resist layer 180 covering at least a portion of the protrusion 172 may be formed on the first build-up insulating layer 111 and the adhesive 160. Also, a second resist layer 190 covering at least a portion of the third build-up wiring layer 123 may be formed on the second build-up insulating layer 112. The first and second resist layers 180 and 190 may be formed by coating and curing an ink-type solder resist, or may be formed by laminating a dry film-type solder resist. Thereafter, a groove portion h for partially opening the protrusion 172 may be formed in the first resist layer 180. The groove portion h may be formed such that the bottom surface may be disposed on a level between the upper surface and the lower surface of the protrusion 172. For example, the groove portion h may be formed through a partial thinning process of the first resist layer 180. Also, an opening for exposing at least a portion of the third build-up wiring layer 123 may be formed in the second resist layer 190.

According to the aforementioned example embodiments, a printed circuit board in which flatness of a front surface on which a semiconductor chip is mounted may be excellent such that expensive processes such as CMP may be unnecessary and price competitiveness may thus be excellent, and a method of manufacturing the same may be provided.

The printed circuit board 100 according to the above-described example may be manufactured through a series of processes. As for the descriptions of the other components, that is, for example, the descriptions described with reference to the printed circuit board 100 according to the above-described example may be applied to the above-described manufacturing example unless otherwise indicated, and thus, overlapping descriptions will not be provided.

In the present disclosure, the meaning on a cross-section may mean a cross-sectional shape when the object is vertically cut, or a cross-sectional shape when the object is viewed from a side-view. Also, the meaning on a plane may be a shape when the object is horizontally cut, or a planar shape when the object is viewed from a top-view or a bottom-view.

In the present disclosure, the lower side, the lower side, the lower surface, or the like, are used to mean the direction toward the mounting surface of the semiconductor package including the organic interposer based on the cross-section of the drawing for convenience, and the upper side, the upper side, the upper surface, or the like, are the opposite direction was used. However, it goes without saying that the direction is defined for convenience of description, and the scope of the claims is not limited to any particular example by the description of this direction.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
a first build-up insulating layer;

an interconnect structure buried in an upper side of the first build-up insulating layer and including one or more insulating layers, one or more wiring layers, and one or more via layers;

an adhesive disposed between an upper surface of the first build-up insulating layer and an upper surface of the interconnect structure, and having an upper surface exposed from the upper surface of the first build-up insulating layer; and a metal bump including a via portion penetrating the adhesive and a protrusion protruding, in a direction from the interconnection structure to the adhesive, from the upper surface of the adhesive to a level above the upper surface of the adhesive, and wherein the via portion and the protrusion include a same material.

2. The printed circuit board of claim 1, wherein the via portion and the protrusion are integrated with each other without a boundary therebetween.

3. The printed circuit board of claim 1, wherein the upper surface of the first build-up insulating layer and the upper surface of the adhesive are substantially coplanar with each other.

4. The printed circuit board of claim 1, further comprising:

a resist layer disposed on the first build-up insulating layer and the adhesive and covering at least a portion of the protrusion.

5. The printed circuit board of claim 4, wherein the resist layer has a groove portion for exposing a portion of the protrusion, and wherein a bottom surface of the groove portion is disposed on a level between upper and lower surfaces of the protrusion.

6. The printed circuit board of claim 1, wherein the first build-up insulating layer include:

a 1-1 build-up insulating layer having a cavity in which the interconnect structure and the adhesive are disposed, and a 1-2 build-up insulating layer disposed on the 1-1 build-up insulating layer, burying the interconnect structure and the adhesive, and disposed in the cavity.

7. The printed circuit board of claim 6, wherein a wall surface of the cavity has a step structure.

8. The printed circuit board of claim 1, further comprising:

a first build-up wiring layer buried in the upper side of the first build-up insulating layer and having an upper surface exposed from the upper surface of the first build-up insulating layer, wherein an upper surface of the first build-up wiring layer is substantially coplanar with the upper surface of the first build-up insulating layer and the upper surface of the adhesive.

9. The printed circuit board of claim 8, further comprising:

a heat dissipation metal layer buried in the upper side of the first build-up insulating layer, and having an upper surface exposed from the upper surface of the first build-up insulating layer, wherein the heat dissipation metal layer has a thickness greater than a thickness of the first build-up wiring layer.

10. The printed circuit board of claim 8, further comprising:

a second build-up wiring layer disposed on a lower surface of the first build-up insulating layer; and a first build-up via layer penetrating through the first build-up insulating layer and connecting the first and second build-up wiring layers to each other.

11. The printed circuit board of claim 10, further comprising:

a second build-up insulating layer disposed on a lower surface of the first build-up insulating layer and burying the second build-up wiring layer;

a third build-up wiring layer disposed on a lower surface of the second build-up insulating layer; and a second build-up via layer penetrating through the second build-up insulating layer and connecting the second and third build-up wiring layers to each other.

12. The printed circuit board of claim 10, wherein a via of the first build-up via layer and the via portion of the metal bump are tapered in opposite directions.

13. The printed circuit board of claim 10, wherein the second build-up wiring layer is connected to a wiring layer of the one or more wiring layers of the interconnect structure through a via in the first build-up insulating layer.

14. The printed circuit board of claim 1, wherein a via of the one or more via layers of the interconnect structure and the via portion of the metal bump are tapered in opposite directions.

15. A printed circuit board, comprising:

a first build-up insulating layer;

an interconnect structure buried in an upper side of the first build-up insulating layer and including one or more insulating layers, one or more wiring layers, and one or more via layers;

an adhesive disposed between an upper surface of the first build-up insulating layer and an upper surface of the interconnect structure, and having an upper surface exposed from the upper surface of the first build-up insulating layer; and a metal bump including a via portion penetrating the adhesive and a protrusion protruding to the upper surface of the adhesive, wherein a via of the one or more via layers of the interconnect structure and the via portion of the metal bump are tapered in opposite directions.

* * * * *